(12) United States Patent
Yuuki et al.

(10) Patent No.: US 7,535,261 B2
(45) Date of Patent: May 19, 2009

(54) LOGIC CIRCUIT

(75) Inventors: Fumio Yuuki, Fujimino (JP); Hiroki Yamashita, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/492,894

(22) Filed: Jul. 26, 2006

(65) Prior Publication Data

US 2007/0069787 A1    Mar. 29, 2007

(30) Foreign Application Priority Data

Sep. 27, 2005   (JP)   ............... 2005-280233

(51) Int. Cl.
- H03K 19/20  (2006.01)
- H03K 19/094 (2006.01)
- H03K 17/16  (2006.01)
- H03K 19/003 (2006.01)
- H03K 19/0175 (2006.01)

(52) U.S. Cl. ............... 326/112; 326/33; 326/80; 326/21

(58) Field of Classification Search ............... 326/112, 326/115, 121, 127

See application file for complete search history.

(56) References Cited

U.S. PATENT DOCUMENTS 6,094,074 A * 7/2000 Chi et al. ............... 326/115
6,127,868 A * 10/2000 Phillips ............... 327/205
7,202,706 B1 * 4/2007 Plasterer et al. ............... 326/127

FOREIGN PATENT DOCUMENTS

| JP | 5-259830 | 10/1993 |
|----|----------|---------|
| JP | 2003-283309 | 10/2003 |

* cited by examiner

*Primary Examiner*—Vibol Tan
*Assistant Examiner*—Matthew C Tabler
(74) *Attorney, Agent, or Firm*—Brundidge & Stanger, P.C.

(57) ABSTRACT

A first current source generating a current I0+I when a control signal is in 'H' level and a current I0 when it is in 'L' level, a current mirror circuit transferring a current generated in the first current source and composed of first and second MOS transistors, and a second current source connected to the second transistor and generating I0+I are provided. Further, a node branched from a connection node between the second transistor and the second current source is formed, and a logic unit including a flip-flop circuit formed of a differential amplifier is driven through the node. The logic unit is in an active state when the control signal is in 'H' level and it is in an inactive state when the signal is in 'L' level. When the logic unit is in an active state, it processes a data input signal to generate data output signal.

10 Claims, 10 Drawing Sheets

CS = H → CC1 = I0 + I
CS = L → CC1 = I0

$CS = H \rightarrow CC1 = I0 + I$
$CS = L \rightarrow CC1 = I0$

PRIOR ART

PRIOR ART

US 7,535,261 B2

LOGIC CIRCUIT

CROSS-REFERENCE TO RELATED APPLICATION

The present application claims priority from Japanese Patent Application No. JP 2005-280233 filed on Sep. 27, 2005, the content of which is hereby incorporated by reference into this application.

TECHNICAL FIELD OF THE INVENTION

The present invention relates to a logic circuit. More particularly, it relates to a technology effectively applied to a logic circuit such as a flip-flop circuit which is required to operate at high speed.

BACKGROUND OF THE INVENTION

For example, a latch circuit using the differential switching scheme similar to that of ECL is described in Japanese Patent Application Laid-Open Publication No. 5-259830 (Patent Document 1). A differential amplifier which is a component of this latch circuit has a two-stage structure in which a bipolar transistor for data input and a current source are connected from a high-potential power source toward a low-potential power source. Furthermore, another bipolar transistor is provided in parallel to this bipolar transistor and it is controlled in accordance with a clock signal. By this means, it becomes possible to switch the active state and the inactive state (cutoff) of the bipolar transistor for data input. When such a structure is used, the switching between an active state and an inactive state of the bipolar transistor for data input can be smoothly performed, and the midpoint noise due to the switching can be reduced.

Also, Japanese Patent Application Laid-Open Publication No. 2003-283309 (Patent Document 2) describes a flip-flop circuit including a differential amplifier and a source follower circuit having one output of the differential amplifier as an input thereof, in which a source of the source follower circuit is connected to a current source via a MOS transistor having the other output of the differential amplifier circuit as an input thereof. This differential amplifier has a three-stage structure in which a MOS transistor for data input, a MOS transistor for clock input, and a current source are connected from a high-potential power source toward a low-potential power source. When such a structure is used, it is possible to sufficiently acquire the output current of the source follower circuit, which makes it possible to achieve the high-speed operation.

SUMMARY OF THE INVENTION

FIG. 9 is a circuit diagram showing an example of the structure of a flip-flop circuit examined prior to the present invention. For example, the flip-flop circuit shown in FIG. 9 includes a clock buffer unit CKBF and a flip-flop logic unit DFF. The clock buffer unit CKBF includes inverter circuits INV1 to INV3 and outputs complementary clock signals CK and /CK to the flip-flop logic unit DFF.

DFF is provided with a differential amplifier circuit unit AMP and a latch circuit unit LT. AMP is composed of MOS transistors M1 and M2 to which complementary data input signal Din is inputted, load resistors R1 and R2, a MOS transistor M5 having a drain connected to a common source of M1 and M2, and a MOS transistor M7 connected to a source of the transistor M5. The clock signal CK is inputted to a gate of the transistor M5. The transistor M7 functions as a current source, and a constant voltage signal VCS is inputted to a gate of the transistor M7. More specifically, similar to the Patent Document 2, AMP has a three-stage structure composed of M1, M2, M5, and M7.

The latch circuit LT includes a MOS transistor M3 having one output of AMP as a gate input and the other output as a drain input, a MOS transistor M4 having a connection relation reverse to that of the MOS transistor M3, and a MOS transistor M6 having a drain connected to a common source of M3 and M4. Furthermore, LT includes the MOS transistor M7 mentioned above functioning as a current source, and M7 is connected to the source of M6 together with the source of M5. Further, the clock signal /CK is inputted to the gate of M6.

In such a structure, when the clock signal CK is in 'H' level, the transistor M5 is turned on and the AMP side is activated, and when the clock signal CK is in 'L' level, the transistor M6 is turned on and the LT side is activated. More specifically, during the period when CK is in 'H' level, the data input signal Din is taken by AMP, and during the period when CK is in 'L' level, the taken signal Din is latched by LT.

However, in the structure in FIG. 9, since AMP has a three-stage structure, resulting loads such as the series resistance and capacitance are increased, and it is difficult to achieve the high-speed operation. For its solution, the method described in Patent Document 1 using the AMP having a two-stage structure is considered. In the case where the technology of the Patent Document 1 is utilized, the structure of AMP is changed so that M5 of FIG. 9 is connected between the sources of M1 and M2 and a power supply voltage node VDD, and the sources of M1 and M2 are connected to M7 functioning as a current source. In this case, for example, when 'L' level of the clock signal CK is inputted to the gate of M5, AMP is put into an active state, while M1 and M2 are put into a cutoff state by M5 when 'H' level thereof is inputted, and AMP is put into an inactive state.

However, in this technology, it is difficult to appropriately control the voltage levels of the clock signal CK between 'H' level and 'L' level. The definite description about the voltage level is not shown in Patent Document 1. However, it is assumed that, when the voltage level of the clock signal varies, the switching of an active state and an inactive state of AMP cannot be sufficiently performed. For its prevention, in order to perform the appropriate switching, amplitude of the voltage level of the clock signal CK is increased so that the M5 can be accurately turned on and off. In such a case, however, the switching speed of M5 is lowered, and the high-speed operation cannot be achieved.

Also, when the structure of FIG. 9 is used, the circuit area thereof is large. FIG. 10 is a schematic diagram showing an example of the layout structure of the flip-flop circuit shown in FIG. 9. In FIG. 10, an element size of PMOS transistors and NMOS transistors included in inverters INV of the clock buffer unit CKBF is, for example, Lg=0.08 μm and W=8 μm. Also, an element size of M1 to M4 in the flip-flop logic unit DFF is, for example, Lg=0.08 μm and W=8 μm. Further, an element size of M5 and M6 in DFF is, for example, Lg=0.08 μm and W=16 μm, and an element size of M7 is Lg=0.8 μm and W=16 μm. Note that PMOS transistors are used for R1 and R2, and a resistance value thereof is set to 400 Ω.

In FIG. 10, a PMOS region, an NMOS region, an NMOS region and a PMOS region are sequentially formed in this order in a vertical direction, and a region for CKBF and a region for DFF are formed by using these regions in a lateral direction. Inverter circuits INV1 to INV3 are included in the region of CKBF, and each inverter circuit is composed of a PMOS array and an NMOS array in which four gates each having Lg=0.08 μm and W=2 μm are arranged to obtain W=8 μm. Consequently, the area of CKBF region is, for example, 10.8 μm×4.2 μm.

In the region of DFF, each of M1 to M4 is formed of an NMOS array in which four gates each having Lg=0.08 μm and W=2 μm are arranged, and each of M5 and M6 is formed of an NMOS array in which eight gates each having Lg=0.08 μm and W=2 μm are arranged. Further, M7 is formed of an NMOS array in which eight gates each having Lg=0.8 μm and W=2 μm are arranged. Consequently, the area of DFF region is, for example, 10.8 μm×16.8 μm. As described above, when the circuit having the three-stage structure as shown in FIG. 9 is used, the layout area thereof is relatively increased as shown in FIG. 10.

In such circumstances, an object of the present invention is to achieve the high-speed operation of various types of logic circuit such as a flip-flop circuit. Also, another object of the present invention is to achieve the area reduction of various types of logic circuit such as a flip-flop circuit. The above and other objects and novel characteristics of the present invention will be apparent from the description of this specification and the accompanying drawings.

The typical ones of the inventions disclosed in this application will be briefly described as follows.

A logic circuit according to the present invention comprises: a current signal generating circuit which generates a first current or a second current smaller than the first current in accordance with a control signal; a current mirror circuit which transfers the current generated in the current signal generating circuit; and a logic unit to which a fourth current obtained by subtracting the current transferred in the current mirror circuit from a third current generated in a current source is supplied. In this logic circuit, the logic unit is put into an active state by the fourth current reflecting the second current when the current signal generating circuit generates the second current, and the logic unit is put into an inactive state by the fourth current reflecting the first current when the current signal generating circuit generates the first current. Also, the logic unit generates a logic output data by processing a logic input data when the logic unit is in the active state.

That is, in such a structure, switching whether or not current is supplied to the logic unit is performed through the current control method based on the control of the subtraction amount of current, not through the usual voltage control method based on ON/Off of the switch. More specifically, when using the current control method, a branch node is provided between the logic unit and a current source, and the current amount at this branch node is controlled, thereby switching whether or not current is supplied to the logic unit. Meanwhile, when using the voltage control method, a switching element has to be inserted between the logic unit and the current source, and switching whether or not current is supplied is performed based on ON/OFF of this switching element. Therefore, when using the current control method, the switching element required in the voltage control method can be eliminated. Accordingly, the number of stages can be reduced and the high-speed operation can be achieved. Also, since the switching element can be eliminated, the circuit area can be reduced.

Also, in the case where MOS transistors are used to form the current mirror circuit described above, it is preferable that the above-described second current is set to have a current value in the range where the VGS-IDS characteristics of the MOS transistors form a linear region. More specifically, the current IDS of the MOS transistor of the current mirror circuit changes within a range between the second current and the first current larger than the second current, and this range is set to be a range having a linear region where the gradient of ΔIDS/ΔVGS is large. By this means, the voltage amplitude of the MOS transistor can be reduced, and the high-speed operation can be achieved.

Note that, as the above-described logic unit, for example, a logic unit including a differential amplifier provided with transistors to be a differential pair can be used. In this case, a common node (tail node) of the transistors to be a differential pair is driven by the fourth current which is controlled by the current control method described above. As a specific example of the logic circuit including a differential amplifier, for example, a flip-flop circuit and a selector circuit are available.

The effects obtained by typical aspects of the present invention will be briefly described below. That is, it is possible to achieve the high-speed operation of a logic circuit. Also, it is possible to reduce the circuit area of a logic circuit.

BRIEF DESCRIPTIONS OF THE DRAWINGS

DESCRIPTIONS OF THE PREFERRED EMBODIMENTS

Figure 1:
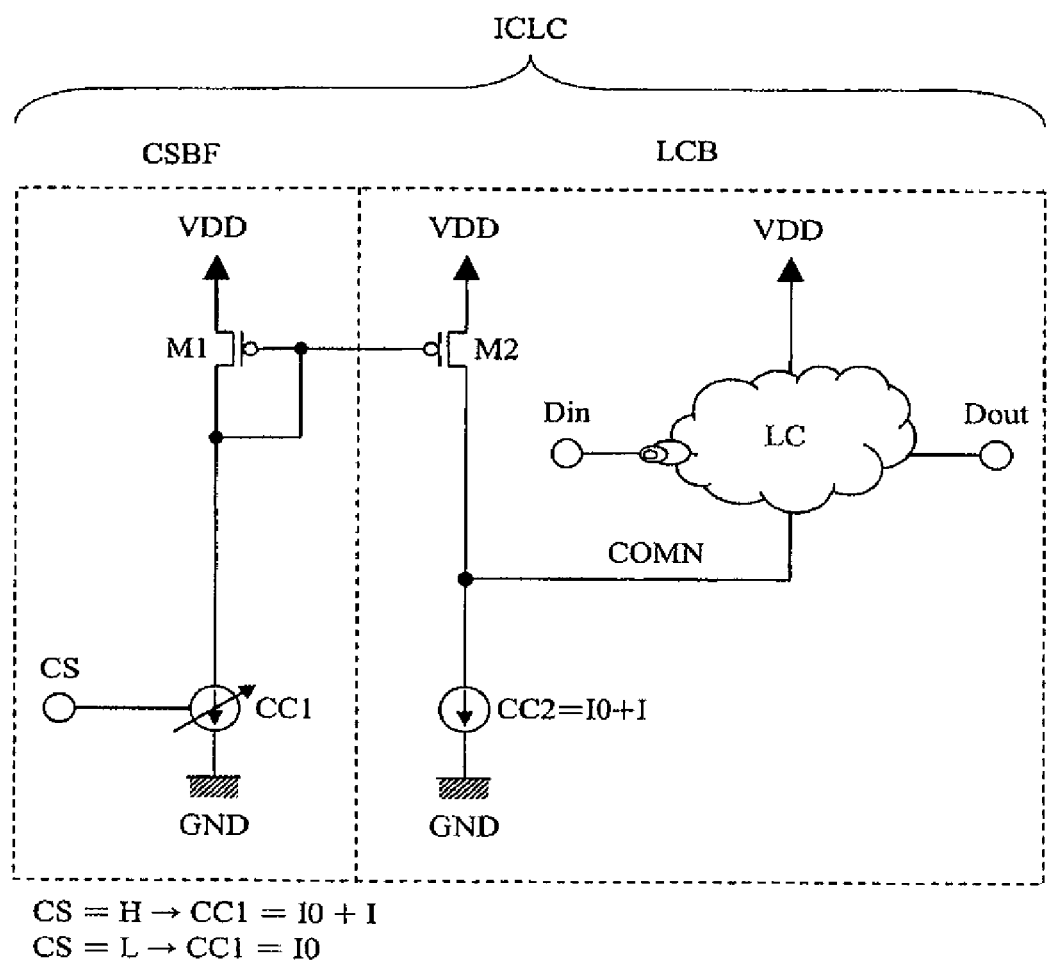
FIG. 1 is a schematic diagram showing an example of the structure of a logic circuit according to one embodiment of the present invention.

Hereinafter, embodiments of the present invention will be described in detail with reference to the accompanying drawings. Note that components having the same function are denoted by the same reference symbols throughout the drawings for describing the embodiment, and the repetitive description thereof will be omitted. Also, circuit elements which form each functional block of the embodiments are not particularly limited. However, they are formed on a semiconductor substrate made of single crystal silicon based on a well-known integrated circuit technology such as a CMOS (Complementary MOS transistor).

Note that, in the embodiments, a MOS (Metal Oxide Semiconductor) is used as an example of the MISFET (Metal Insulator Semiconductor Field Effect Transistor). In the drawings, a circular sign is attached to a gate of a P channel MOS transistor (PMOS transistor) so as to distinguish it from an N channel MOS transistor (NMOS transistor). The connection of substrate potential of the MOS transistor is not particularly shown in the drawings. However, the connection thereof is not particularly limited as long as the MOS transistor can be normally operated.

FIG. 1 is a schematic diagram showing an example of a structure of a logic circuit according to one embodiment of the present invention. A logic circuit ICLC shown in FIG. 1 is provided with a control signal buffer unit CSBF which receives a control signal CS of 'H' level/'L' level (control signal node) and then generates various currents in accordance with each level and a logic block LCB which performs the logic operation by use of the current generated by CSBF.

CSBF includes a current source CC1 which generates various current in accordance with the control signal CS and a PMOS transistor M1 connected to CC1. One end of CC1 is connected to a drain of M1 and the other end thereof is connected to a ground voltage node GND. When the control signal CS is in 'H' level, CC1 generates the current "I0+I", and when CS is in 'L' level, it generates the current "I0". A source of M1 is connected to a power supply voltage node VDD and a gate and a drain thereof are connected in common. That is, M1 is diode-connected and functions as one part of the current mirror circuit.

LCB includes a PMOS transistor M2 which forms the other part of the current mirror circuit, a current source CC2 connected to M2, and a logic unit LC connected to a node COMN branched from a connection point between M2 and CC2. M2 has an element size equal to that of M1, and a source of M2 is connected to VDD, a gate thereof is connected to the gate of M1, and a drain thereof is connected to one end of CC2. CC2 supplies the current "I0+I", and one end thereof is connected to M2 and the other end thereof is connected to GND. LC includes a data input node (data input signal) Din and a data output node (data output signal) Dout and is connected to VDD and COMN.

In such a structure, when 'H' level signal is inputted as the control signal CS, current "I0+I" generated by CC1 is transferred to the drain of M2 via the current mirror circuit of M1 and M2. However, since the current source CC2 which supplies the current "I0+I" is connected to the drain of M2, the current supplied to the node COMN is 0. Meanwhile, when 'L' level signal is inputted as the control signal CS, the current "I0" generated by CC1 is transferred to the drain of M2 via the current mirror circuit of M1 and M2. Therefore, the current "I" obtained by subtracting the current "I0" from the current "I0+I" of CC2 is supplied to the node COMN.

In this case, the circuit applied as the logic unit LC includes an internal circuit in which the active state and the inactive state are selected in accordance with the control signal CS, and this internal circuit has a function to process the signal Din and then output Dout at the time when the active state is selected by CS. More specifically, by controlling the magnitude of the drive current of the internal circuit from VDD to GND in accordance with the control signal CS, the active state/inactive state of the internal circuit is switched. In the example shown in FIG. 1, when 'H' level signal is inputted as CS, LC is put into an inactive state by the current "0" of COMN, and when 'L' level signal is inputted as CS, LC is put into an active state by the current "I" of COMN.

Figure 2A:
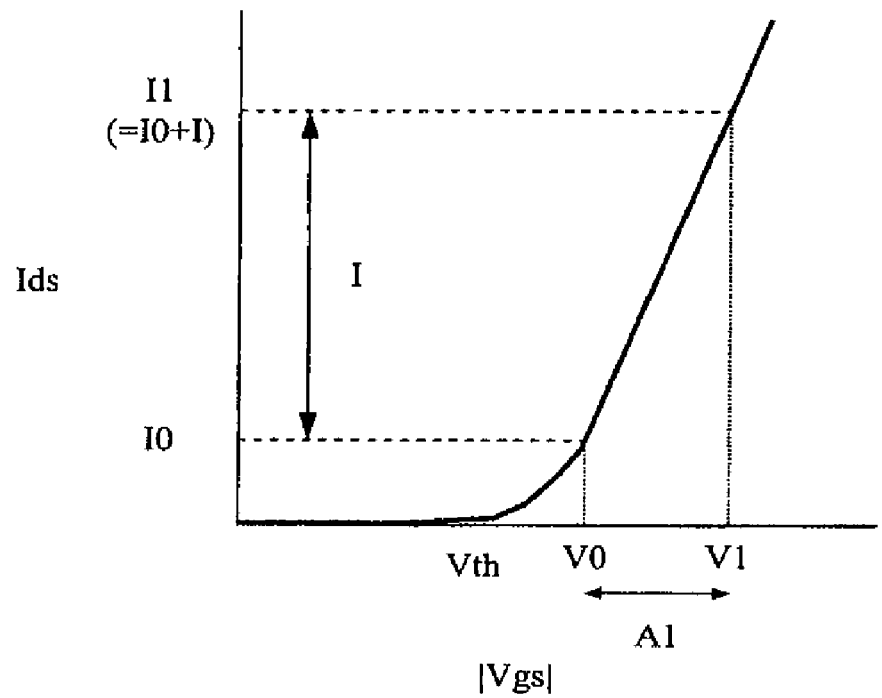
FIG. 2A is an explanatory diagram showing an example of operation characteristics of the current mirror circuit of FIG. 1.
Figure 2B:
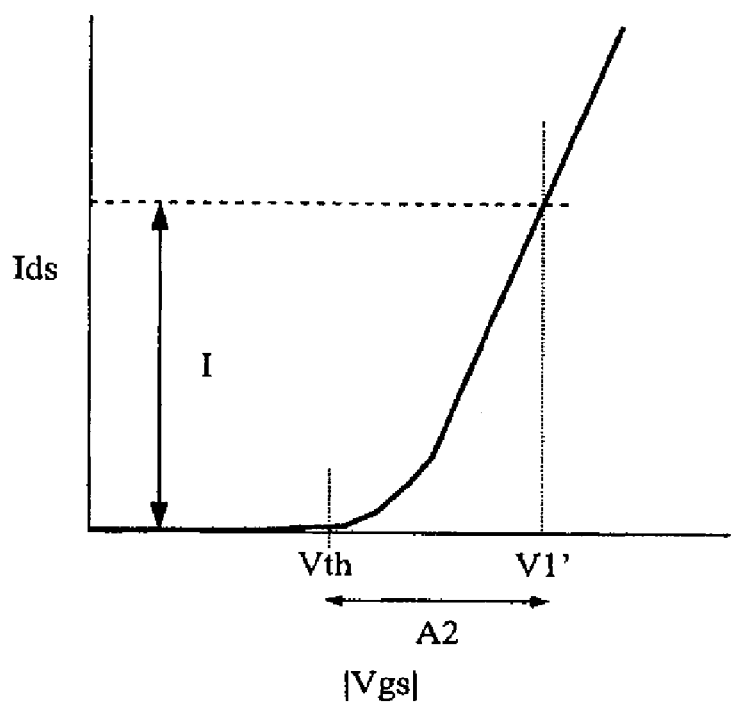
FIG. 2B is an explanatory diagram showing another example of the operation characteristics as a comparison example of FIG. 2A.

If the structure as described above is used, it is possible to quickly switch the active state/inactive state of the internal circuit in the logic unit LC as shown in FIG. 2. FIG. 2 is an explanatory diagram for the high-speed operation achieved when using the logic circuit of FIG. 1, in which FIG. 2A is a diagram showing an example of the operation characteristics of the current mirror circuit of FIG. 1 and FIG. 2B is a diagram showing another example of the operation characteristics as a comparison example of FIG. 2A.

FIG. 2A shows the relation between a gate-source voltage |Vgs| and a source-drain current Ids of the MOS transistors M1 and M2 which form the current mirror circuit of FIG. 1. As shown in this drawing, in the structure in FIG. 1, the current source CC1 supplies "I0" and "I0+I" in accordance with the control signal CS. Therefore, |Vgs| of M1 and M2 changes with amplitude A1 between the voltage V0 and the voltage V1. At this time, the range between V0 and V1 ("I0" and "I0+I") is set to be a linear region higher than the threshold voltage Vth where the value of the conductance gm of M1 and M2 is large. Therefore, this amplitude A1 is small, and high-speed transition can be realized.

On the other hand, in FIG. 2B, the structure where the current source CC1 of FIG. 1 is switches the current between "0" and "1" in accordance with the control signal CS is assumed, and the Ids-|Vgs| characteristics of M1 and M2 in this case is shown. Also in the case where the technology of the Patent Document 1 is used, the operation thereof is similar to that of FIG. 2B. In such a structure, when the current of M1 and M2 is 0, |Vgs| is reduced to the threshold voltage Vth or lower, and when the current of M1 and M2 is I, |Vgs| becomes V1'. However, since |Vgs| is reduced to Vth or lower, the amplitude A2 of |Vgs| of M1 and M2 becomes larger than the above-described amplitude A1. Therefore, it is difficult to realize the high-speed transition.

Note that, in the technology of the Patent Document 1, an NMOS transistor is used instead of a PMOS transistor of FIG. 1, the control signal CS is directly applied to a gate of this NMOS transistor, and then, the gate voltage thereof is controlled. In the NMOS transistor structure as described above, it is difficult to achieve the small amplitude operation as described in FIG. 2A. However, provided that the PMOS transistor is used, the small amplitude operation as shown in FIG. 2A can be realized in theory by adjusting the 'H' level voltage of CS to V1 and adjusting the 'L' level voltage thereof to V0.

However, in an actual use, since it can be expected that the voltage level of CS fluctuates, it is difficult to realize the small amplitude operation as shown in FIG. 2A through such a voltage control. More specifically, in practice, since it is necessary to provide a margin for the voltage level of CS, the large amplitude operation as shown in FIG. 2B is inevitable. For its solution, by performing the current control using the current mirror circuit as shown in the structure of FIG. 1 instead of the voltage control as described above, the small amplitude operation as described in FIG. 2A can be realized without fail.

Also, in FIG. 1 and FIG. 2, the description has been made under the condition that M1 and M2 have the same element size. However, it is also possible to use M1 having the element size smaller than that of M2. For example, when the ratio of the element size is set to M1:M2=1:N, the current generated from CC1, that is, "I0+I" or "I0" is changed to "(I0+I)/N" or "I0/N". By this means, the size of circuit elements which form CSBF can be reduced, which makes it possible to reduce the circuit area. Further, since the resistance and capacitance load in each circuit element are reduced, the switching speed of current in accordance with CS can be increased depending on circumstances.

As described above, in the structure example as shown in FIG. 1, where the MOS transistor M2 is operated within the linear region where it does not reach the cutoff state by using the bias current "I0", the switching speed of M2 is increased, and thus it becomes possible to switch the current of the node COMN at high speed. Consequently, since the active state and the inactive state of the internal circuit which is a circuit in the logic unit LC and is controlled by the node COMN can be switched at high speed, the high-speed operation of the logic circuit ICLC can be achieved. Note that, in FIG. 1, the current of the node COMN is defined as "I" and "0" and the switching between the active state and the inactive state of the internal circuit is performed in accordance with them. However, it is not always necessary that the current to switch the state to an inactive state is "0" but it may be a value close to "0". That is, it is not always necessary that the current source CC2 is "I0+I" but it may be a value close to it.

Figure 3:
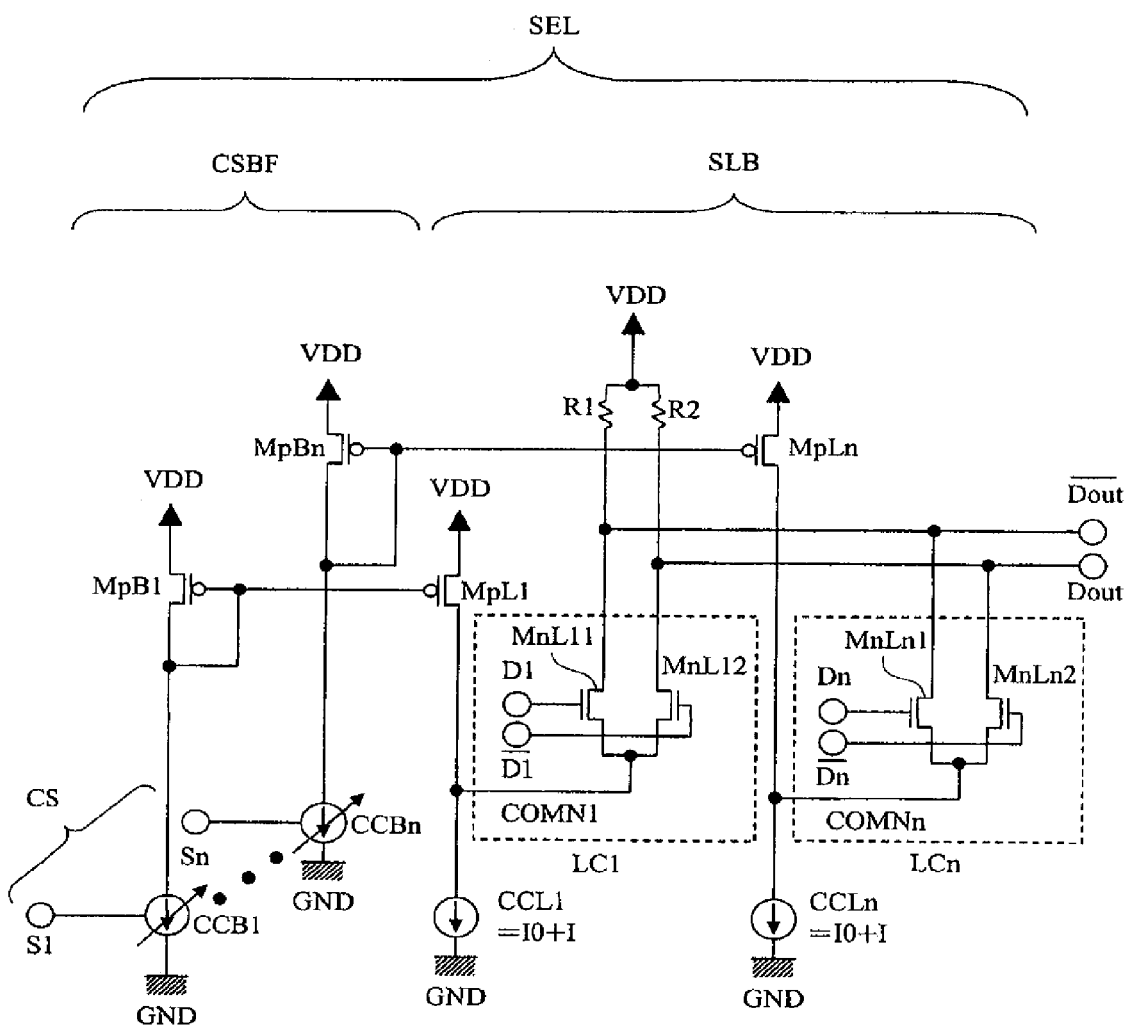
FIG. 3 is a circuit diagram showing an example of the structure in the case where the logic circuit shown in FIG. 1 is applied to a selector circuit.

FIG. 3 is a circuit diagram showing an example of the structure in the case where the logic circuit shown in FIG. 1 is applied to a selector circuit. A selector circuit SEL of FIG. 3 is composed of the control signal buffer unit CSBF similar to that shown in FIG. 1 and a selector logic block SLB. In CSBF, a buffer circuit is individually provided to each of n (n≧2) selector control signals (selector control node) S1 to Sn. More specifically, a PMOS transistor MpB1 functioning as one part of the current mirror circuit and a current source CCB1 are provided for S1, and a PMOS transistor MpBn functioning as one part of the current mirror circuit and a current source CCBn are provided for Sn.

MpB1 has a source connected to the power supply voltage node VDD and a gate and a drain connected to CCB1 and a gate of a later-described PMOS transistor MpL1 functioning as the other part of the current mirror circuit. CCB1 is provided between MpB1 and the ground voltage node GND, and for example, it generates the current "I0+I" when S1 is in the 'H' level and generates the current "I0" when S1 is in the 'L' level. Similarly, MpBn also has a source connected to VDD and a gate and a drain connected to CCBn and a gate of a later-described PMOS transistor MpLn functioning as the other part of the current mirror circuit. CCBn is provided between MpBn and GND, and for example, it generates the current "I0+I" when Sn is in the 'H' level and generates the current "I0" when Sn is in the 'L' level.

In the selector logic block SLB, the PMOS transistor MpL1, a current source CCL1, and the logic unit LC1 are provided for S1 described above, and the PMOS transistor MpLn, a current source CCLn, and the logic unit LCn are provided for Sn described above. MpL1 for S1 functions as the other part of the current mirror circuit, and it has a source connected to VDD, a gate connected to a gate of MpB1, and a drain connected to CCL1. CCL1 is provided between MpL1 and GND and generates "I0+I". Also, a node COMN1 is provided at a portion branched from the connection point between MpL1 and CCL1.

The logic unit LC1 includes NMOS transistors MnL11 and MnL12 to be a differential pair, and sources of MnL11 and MnL12 are connected in common to the node COMN1. A gate of MnL11 is connected to a data input node (data input signal) D1 and a gate of MnL12 is connected to a data input node (/D1) corresponding to a complementary signal of D1. A drain of MnL11 is connected to VDD via a resistor element (load element) R1, and a drain of MnL12 is also connected to VDD via a resistor element R2. Further, a drain of MnL11 is connected to the data output node (data output signal) (/Dout), and a drain of MnL12 is connected to the data output node Dout corresponding to the complementary signal of /Dout.

On the other hand, MpLn for Sn functions as the other part of the current mirror circuit, and a source thereof is connected to VDD, a gate thereof is connected to a gate of MpBn, and a drain thereof is connected to CCLn. CCLn is provided between MpLn and GND, and it generates the current "I0+I". Also, a node COMNn is provided at a portion branched from the connection point between MpLn and CCLn.

The logic unit LCn includes NMOS transistors MnLn1 and MnLn2 to be a differential pair, and sources of MnLn1 and MnLn2 are connected in common to the node COMNn. A gate of MnLn1 is connected to a data input node Dn, and a gate of MnLn2 is connected to a data input node (/Dn) corresponding to a complementary signal of Dn. A drain of MnLn1 is connected to a data output node (/Dout) in common with MnL11, and a drain of MnLn2 is connected to a data output node Dout in common with MnL12. Note that, as the load elements of MnLn1 and MnLn2 to be a differential pair, the resistor elements R1 and R2 are used in common with MnL11 and MnL12.

In such a structure, when one of the selector control signals S1 to Sn is in the 'L' level and the others are in the 'H' level, any of the data input signals D1 to Dn (/D1 to /Dn) corresponding to the 'L' level is taken out as the data output signal Dout (/Dout). For example, when S1 is selected to be 'L' level and Sn is selected to be 'H' level, the current supplied to the tail node COMN1 of the logic unit LC1 is "I", and the current supplied to the tail node COMNn of the logic unit LCn is "0". Therefore, LC1 is in an active state and LCn is in an inactive state.

In LC1 in an active state, D1 and /D1 are taken by the differential amplifier composed of MnL11, MnL12, R1 and R2 and are outputted as Dout and /Dout. Meanwhile, in LCn in an inactive state, the potential of COMNn is increased, and at least one of MnLn1 and MnLn2 is in a cutoff state. Therefore, it does not affect Dout and /Dout.

As described above, when the selector circuit as shown in FIG. 3 is used, the two-stage structure of the differential amplifier (for example, the stage of MnL11 and MnL12 and the stage of the CCL1) can be realized, and the selecting operation (switching operation between active state and inactive state) of the logic units LC1 to LCn by means of the current mirror circuit as described with reference to FIG. 1 and FIG. 2 can be performed at high speed. Therefore, the high-speed operation of the selector circuit can be achieved. Note that, in FIG. 3, the resistor elements R1 and R2 are shown as the load elements of the differential amplifier. However, it goes without saying that the load elements are not limited to the resistor elements, but the MOS transistors and others can be used for the load elements.

Figure 4:
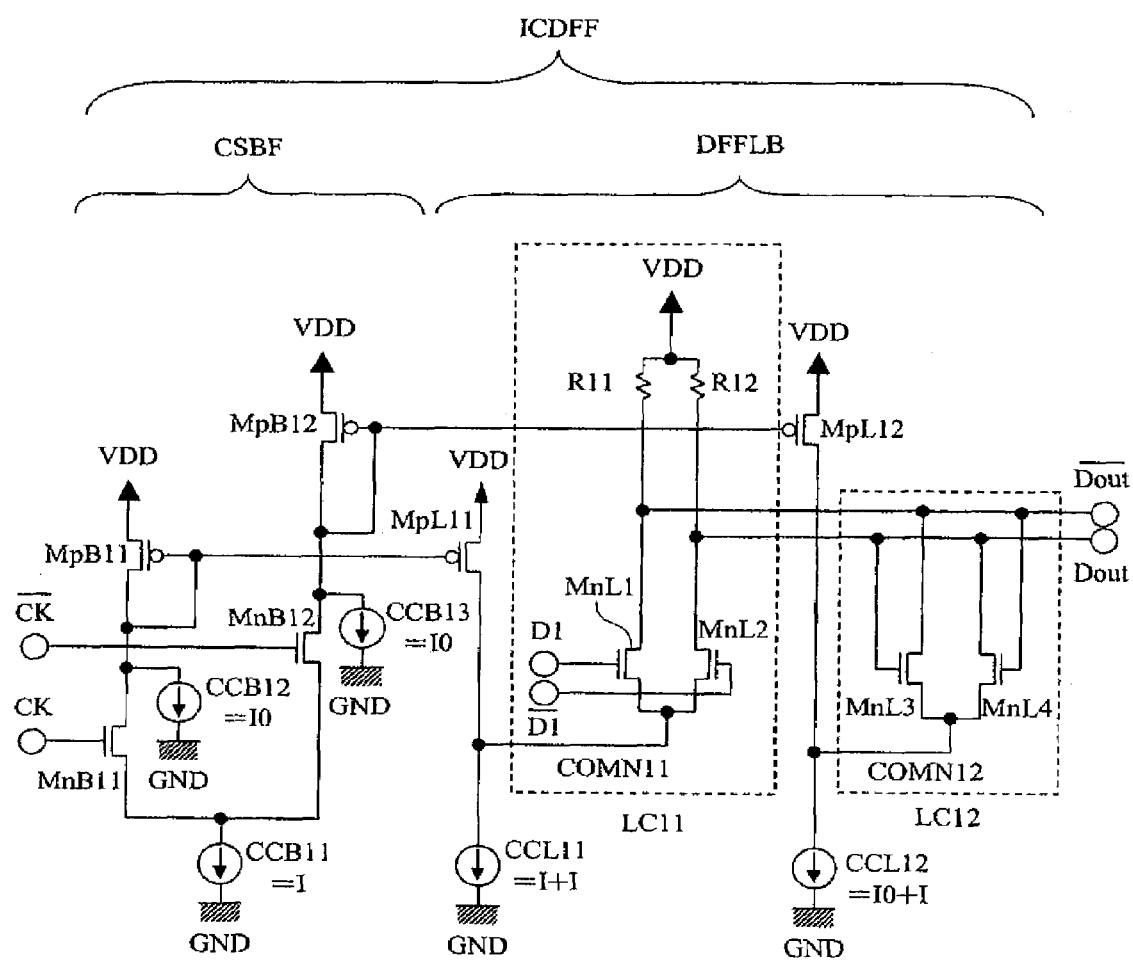
FIG. 4 is a circuit diagram showing an example of the structure in the case where the logic circuit shown in FIG. 1 is applied to a flip-flop circuit.

FIG. 4 is a circuit diagram showing an example of the structure in the case where the logic circuit of FIG. 1 is applied to a flip-flop circuit. A flip-flop circuit ICDFF of FIG. 4 is composed of the control signal buffer unit CSBF similar to that shown in FIG. 1 and a flip-flop logic block DFFLB. In CSBF, two systems of buffer circuits are provided for the clock signals (clock signal node) CK and /CK. More specifically, a PMOS transistor MpB11 functioning as one part of the current mirror circuit, a current source CCB12, an NMOS transistor MnB11, and a current source CCB11 commonly used in the two systems are provided for CK. Also, a PMOS transistor MpB12 functioning as one part of the current mirror circuit, a current source CCB13, an NMOS transistor MnB12, and the current source CCB11 commonly used in the two systems are provided for /CK.

MpB11 has a source connected to the power supply voltage node VDD and a gate and a drain connected to CCB12, a drain of MnB11, and a gate of the PMOS transistor MpL11 functioning as the other part of the current mirror circuit described later. CCB12 is provided between a drain of MpB11 and the ground voltage node GND, and it generates the current "I0". MnB11 has a source connected to one end of CCB11, a gate connected to CK, and a drain connected to MpB11. CCB11 has one end connected to MnB11 and the other end connected to GND, and it generates "I".

Also, MpB12 has a source connected to the power supply voltage node VDD and a gate and a drain connected to CCB13, a drain of MnB12, and a gate of the PMOS transistor MpL12 functioning as the other part of the current mirror circuit described later. CCB13 is provided between a drain of MpB12 and the ground voltage node GND, and it generates the current "I0". MnB12 has a source connected to one end of CCB11 in common with MnB11, a gate connected to /CK, and a drain connected to MpB12.

In the flip-flop logic block DFFLB, a PMOS transistor MpL11, a current source CCL11, and a logic unit LC11 are provided for above-described CK, and a PMOS transistor MpL12, a current source CCL12, and a logic unit LC12 are provided for above-described /CK. MpL11 for CK functions as the other part of the current mirror circuit, and it has a source connected to VDD, a gate connected to a gate of MpB11, and a drain connected to CCL11. CCL11 is provided between MpL11 and GND and it generates the current "I0+I". Also, a node COMN11 is provided at a portion branched from the connection point between MpL11 and CCL11.

The logic unit LC11 includes NMOS transistors MnL1 and MnL2 to be a differential pair, and sources of MnL1 and MnL2 are connected in common to the node COMN11. A gate of MnL1 is connected to the data input node (data input signal) D1, and a gate of MnL2 is connected to the data input node (/D1) corresponding to the complementary signal of D1. A drain of MnL1 is connected to VDD via a resistor element (load element) R11, and a drain of MnL2 is also connected to VDD via a resistor element R12. Further, a drain of MnL1 is connected to the data output node (data output signal) (/Dout), and a drain of MnL2 is connected to the data output node Dout corresponding to the complementary signal of /Dout. The logic unit LC11 as described above functions as a data intake circuit in the flip-flop circuit.

Meanwhile, MpL12 for /CK functions as the other part of the current mirror circuit, and it has a source connected to VDD, a gate connected to a gate of MpB12, and a drain connected to CCL12. CCL12 is provided between MpL12 and GND and it generates the current "I0+I". Also, a node COMN12 is provided at a portion branched from the connection point between MpL12 and CCL12.

The logic unit LC12 includes NMOS transistors MnL3 and MnL4 to be a differential pair, and sources of MnL3 and MnL4 are connected in common to the node COMN12. A gate of MnL3 is connected to the data output node Dout, and a gate of MnL4 is connected to the data output node (/Dout). With a connection relation reverse to this gate, a drain of MnL3 is connected to /Dout, and a drain of MnL4 is connected to Dout. Note that, as the load elements of MnL3 and MnL4 to be a differential pair, the resistor elements R11 and R12 are used in common with MnL1 and MnL2. The logic unit LC12 as described above functions as a data latch circuit in the flip-flop circuit.

In such a structure, when the clock signal CK is in the 'L' level (/CK is in 'H' level), the MnB11 is turned off, and similar to the case of FIG. 1, the current "I0" is supplied to the current mirror circuit MpB11 and MpL11, and the current "I" is thus supplied to the node COMN11. On the contrary, MnB12 is turned on and the current "I0+I" is supplied to the current mirror circuit MpB12 and MpL12, and thus, the current of the node COMN12 becomes "0". More specifically, during the period when CK is in 'L' level, LC11 to be the data intake circuit is in an active state and LC12 to be the data latch circuit is in an inactive state.

In LC11 in an active state, D1 and /D1 are taken by the differential amplifier composed of MnL1, MnL2, R11, and R12 and are outputted as Dout and /Dout. For example, when D1 is in 'H' level (/D1 is in 'L' level), 'H' level is outputted to Dout (/Dout is in 'L' level). Meanwhile, in LC12 in an inactive state, the potential of COMN12 is increased, and at least one of MnL3 and MnL4 is in a cutoff state. Therefore, it does not affect Dout and /Dout.

Thereafter, when the clock signal is switched and CK is in 'H' level (/CK is in 'L' level), MnB11 is turned on and the current "I0+I" is supplied to the current mirror circuit MpB11 and MpL11, and thus, the current of the node COMN11 becomes "0". On the contrary, MnB12 is turned off and the current "I0" is supplied to the current mirror circuit MpB12 and MpL12, and thus, the current of the node COMN12 becomes "I". More specifically, during the period when CK is in 'H' level, LC11 to be the data intake circuit is in an inactive state and LC12 to be the data latch circuit is in an active state.

In LC12 in an active state, the data output signals Dout and /Dout are taken during the period when CK described above is in 'L' level by the differential amplifier composed of MnL3, MnL4, R11, R12, and CCL12 to maintain (latch) the state of Dout and /Dout. More specifically, since the latch connection in which the inverted output (drain output) of one transistor (for example, MnL3) to be the differential pair corresponds to the gate input of the other transistor (for example, MnL4) to be the differential pair is provided in LC12, Dout and /Dout can be latched. Meanwhile, in LC11 in an inactive state, the potential of COMN11 is increased, and at least one of MnL1 and MnL2 is in a cutoff state. Therefore, it does not affect Dout and /Dout.

Figure 5:
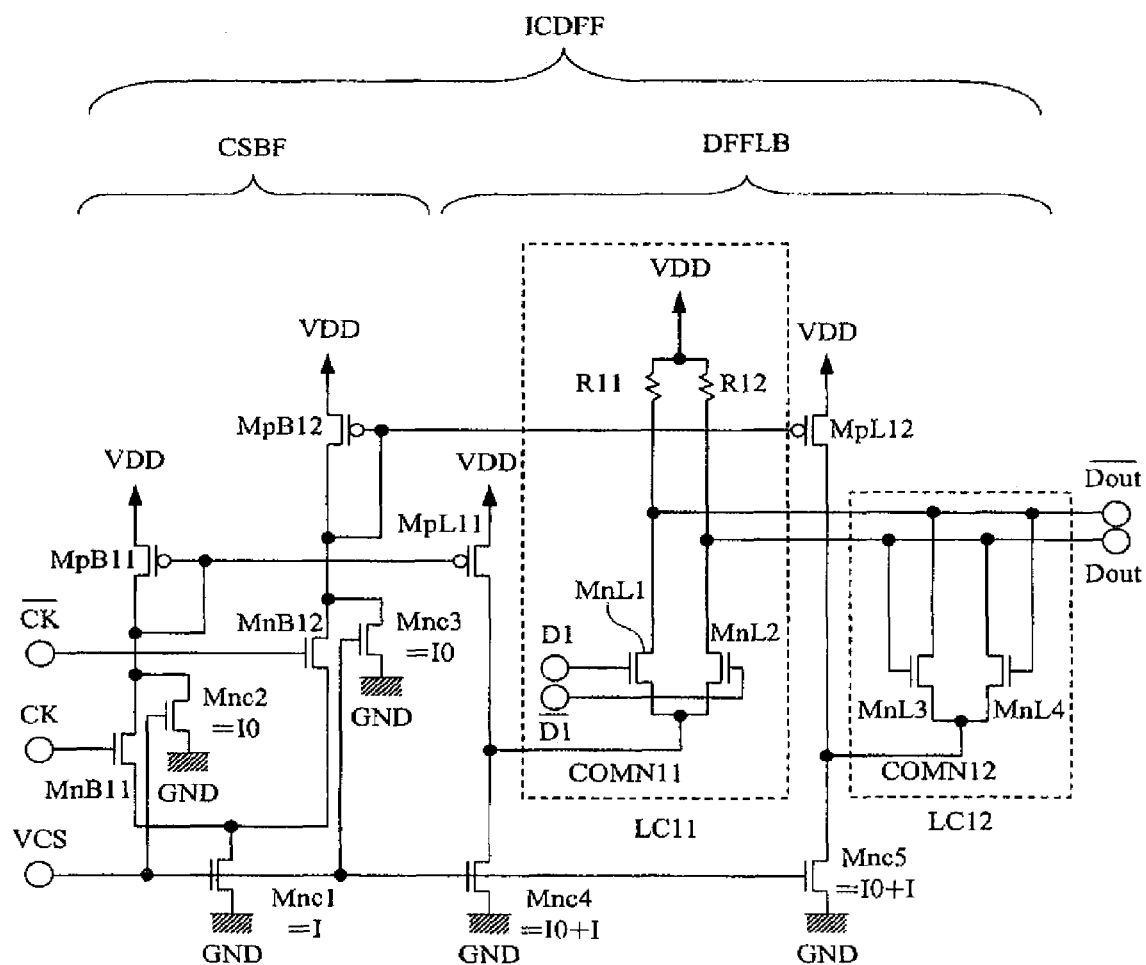
FIG. 5 is a circuit diagram showing an example in the case where transistors are used to form the current source of the flip-flop circuit in FIG. 4.

FIG. 5 is a circuit diagram showing an example in the case where transistors are used to form the current source of the flip-flop circuit in FIG. 4. In FIG. 5, CCB11, CCB12, and CCB13 of FIG. 4 are respectively formed of NMOS transistors Mnc1, Mnc2, and Mnc3 each having the constant voltage signal (constant voltage node) VCS as a gate input thereof. Also, CCL11 and CCL12 of FIG. 4 are respectively formed of NMOS transistors Mnc4 and Mnc5 each having VCS as a gate input thereof.

In this case, the currents of Mnc2 and Mnc3 are "I0", the current of Mnc1 is "I", and the currents of Mnc4 and Mnc5 are "I0+I", and the condition I0<I is usually satisfied. Therefore, the element size of the transistors Mnc1 to Mnc5 is adjusted in accordance with the magnitude of the currents. These transistors have such a relationship in element size as Mnc2=Mnc3, Mnc4=Mnc5, and Mnc2<Mnc1<Mnc4 in general. Since the structure and operation other than this are similar to those shown in FIG. 4, the description thereof is omitted.

As described above, by using the flip-flop circuit as shown in FIG. 4 and FIG. 5, the two-stage structure of the differential amplifier (for example, the stage of MnL1 and MnL2 and the stage of CCL11) can be realized, and further, the switching between an active state and an inactive state (switching between data intake and data latch) of the logic units LC11 and LC12 by means of the current mirror circuit can be performed at high speed. Therefore, it is possible to achieve the high-speed operation of the flip-flop circuit. Note that the flip-flop circuit shown in FIG. 4 and FIG. 5 is sometimes called a latch circuit, and in contrast, the circuit operated by an edge trigger of a clock is called a flip-flop circuit in some cases. The flip-flop circuit operated by the edge trigger can be readily realized by providing two sets of the structure shown in FIG. 4 and FIG. 5 and setting one of them as a master and the other as a slave.

Figure 6:
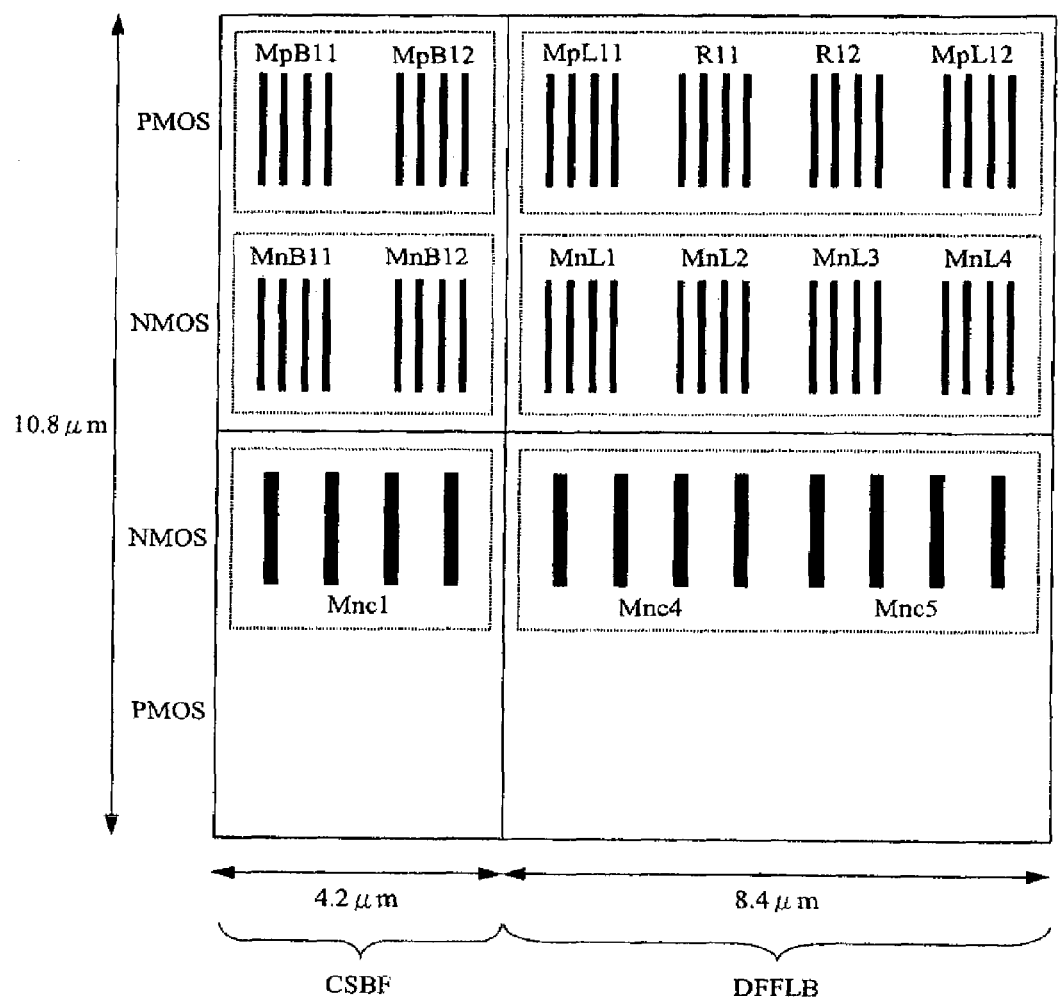
FIG. 6 is a schematic diagram showing an example of the layout structure of the flip-flop circuit of FIG. 5.

In addition, when the flip-flop circuit as shown in FIG. 4 and FIG. 5 is used, the reduction in circuit area can be achieved as shown in FIG. 6. FIG. 6 is a schematic diagram showing an example of the layout structure of the flip-flop circuit of FIG. 5.

In FIG. 6, the PMOS transistors MpB11 and MpB12 and the NMOS transistors MnB11 and MnB12 included in the control signal buffer unit CSBF are designed to have the element size of, for example, Lg=0.08 μm and W=8 μm. Furthermore, the NMOS transistor Mnc1 to be the current source in the CSBF is designed to have the element size of Lg=0.8 μm and W=8 μm. The current of Mnc1 "I" is, for example, 1 mA, and the current of Mnc2 and Mnc3 "I0" is, for example, 0.1 μm. In this case, the element size of Mnc2 and Mnc3 is about one-tenth as large as that of Mnc1. However, since it is the ignorable size relative to that of Mnc1, the illustration thereof is omitted in FIG. 6.

Also, the PMOS transistors MpL11 and MpL12 and the NMOS transistors MnL1 to MnL4 in the flip-flop logic block DFFLB are designed to have the element size of Lg=0.08 μm and W=8 μm. Further, the NMOS transistors Mnc4 and Mnc 5 to be the current source in DFFLB are designed to have the element size of Lg=0.8 μm and W=8 pin. Note that PMOS transistors are used for R11 and R12, and the resistance value thereof is set to 400 Ω.

In FIG. 6, a PMOS region, an NMOS region, an NMOS region and a PMOS region are sequentially formed in this order in a vertical direction, and a region for CSBF and a region for DFFLB are formed by using these regions in a lateral direction. In the region of CSBF, the transistors MpB11, MpB12, MnB11, and MnB12 are formed in upper two regions (PMOS region and NMOS region). Each transistor is formed of a PMOS array or an NMOS array in which four gates each having Lg=0.08 μm and W=2 μm are arranged to obtain W=8 μm. Also, in the region of CSBF, the transistor Mnc1 is formed in the third region from the top (NMOS region). Mnc1 is formed of an NMOS array in which four gates each having Lg=0.8 μm and W=2 μm are arranged to obtain W=8 μm. In the layout structure as described above, the area of CSBF region is, for example, 10.8 μm×4.2 μm.

Meanwhile, in the region of DFFLB, the transistors MpL11, MpL12, MnL1 to MnL4, and R11 and R12 are formed in upper two regions (PMOS region and NMOS region). Each of them is formed of a PMOS array or an NMOS array in which four gates each having Lg=0.08 μm and W=2 μm are arranged. Also, in the region of DFFLB, the transistors Mnc4 and Mnc5 are formed in the third region from the top (NMOS region). Mnc4 and Mnc5 are formed of an NMOS array in which four gates each having Lg=0.8 μm and W=2 μm are arranged. In the layout structure as described above, the area of DFFLB region is, for example, 10.8 μm×8.4 μm.

Figure 10:
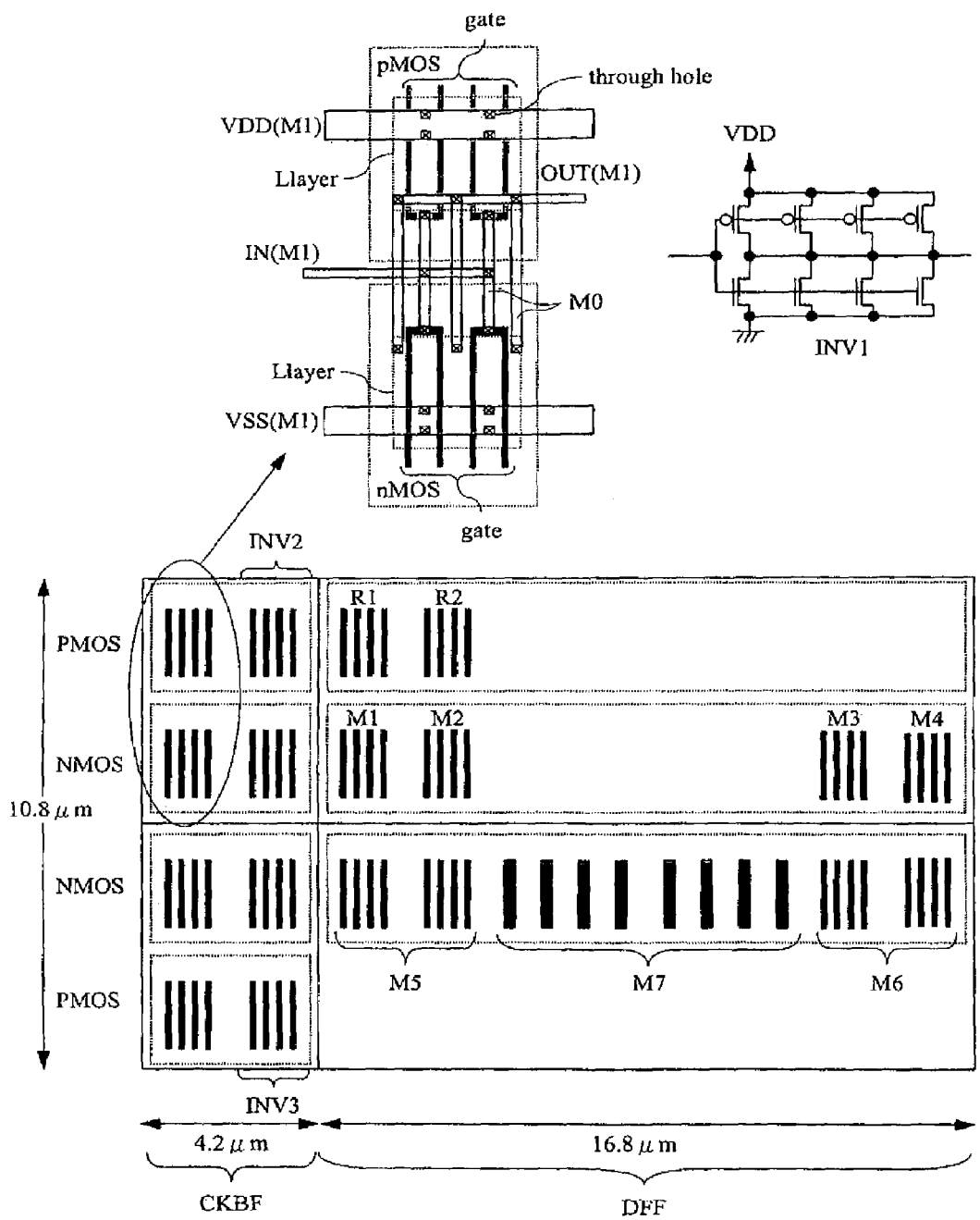
FIG. 10 is a schematic diagram showing an example of the layout structure of the flip-flop circuit shown in FIG. 9.

As described above, when the differential amplifier having the two-stage structure as shown in FIG. 5 is used, the part corresponding to one stage can be removed from the layout structure of the differential amplifier having the three-stage structure of NMOS transistors as shown in FIG. 10, and the corresponding area reduction can be achieved. For example, in the layout structure shown in FIG. 10, the area of the flip-flop logic unit DFF is 10.8 μm×16.8 μm. Meanwhile, the area of the flip-flop logic block DFFLB is 10.8 μm×8.4 μm in the layout structure of FIG. 6, that is, it is reduced to about half of DFF.

Figure 7A:
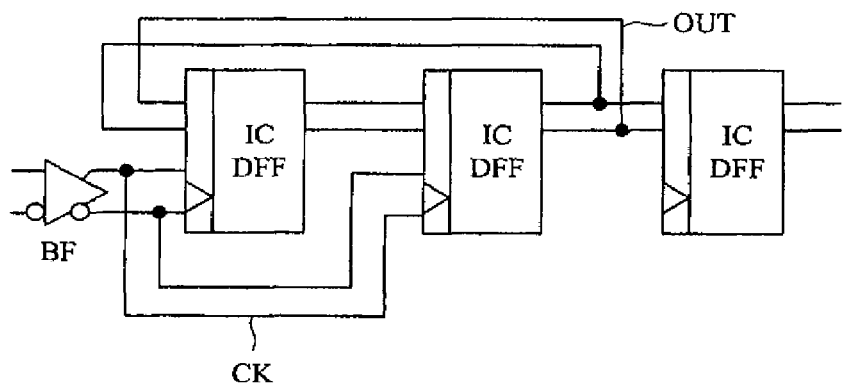
FIG. 7A is a circuit diagram showing the structure used in the simulation using the flip-flop circuit shown in FIG. 4.
Figure 7B:
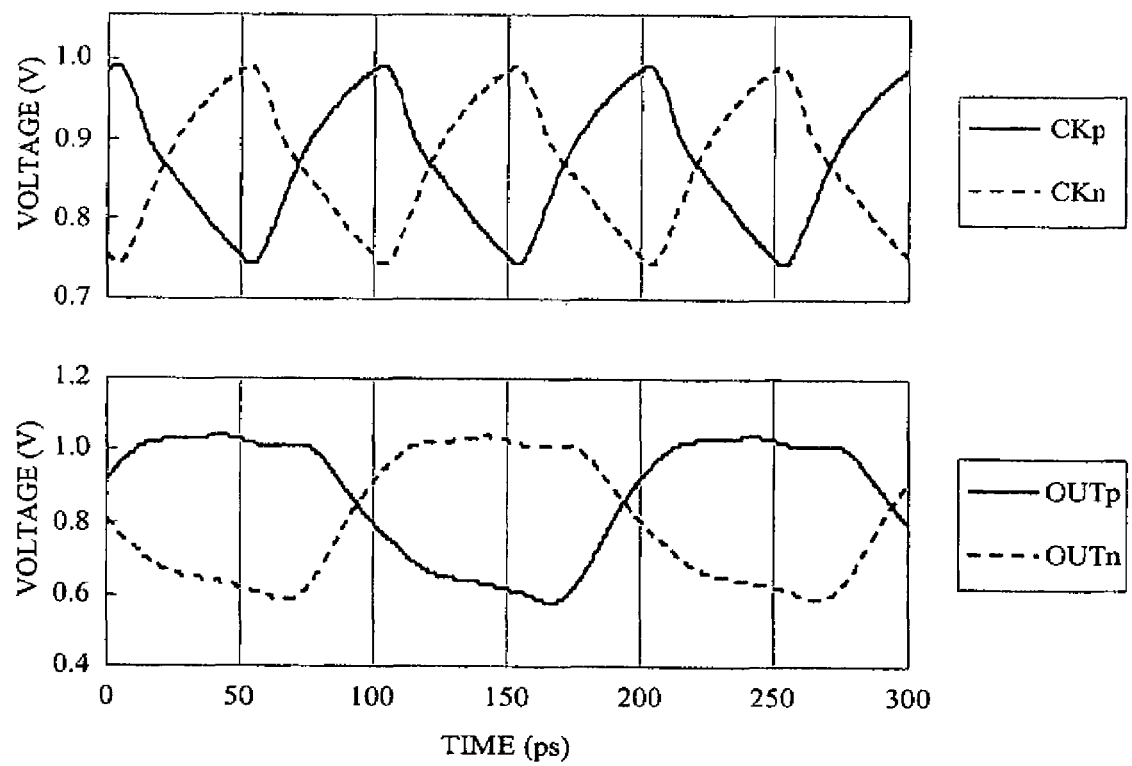
FIG. 7B is an operation waveform diagram showing the result of the simulation using the flip-flop circuit shown in FIG. 4.

FIG. 7 is a diagram showing an example of the results of the simulation using the flip-flop circuit shown in FIG. 4, in which FIG. 7A is a circuit diagram showing the structure used in this simulation and FIG. 7B is an operation waveform diagram in this simulation. In FIG. 7A, two-stage connection of the flip-flop circuit ICDFF of FIG. 4 is formed, in which clock signals CK of opposite phases are supplied to the front stage and the latter stage thereof and feedback from the data output node of the latter stage to the data input node of the front stage is performed. Note that, although one additional stage of ICDFF is connected to the data output node of the latter stage, this is provided in order to enhance the accuracy of the simulation including the input/output capacitance.

The circuit with such a structure of the ICDFFs connected in two stages functions as a flip-flop circuit using the edge trigger, in which ICDFF of the front stage is used as a master and ICDFF of the latter stage is used as a slave. Also, since the data output node (reverse side) of the flip-flop circuit of the edge trigger is fed back to the data input node, it functions as a frequency divider.

Then, when the clock signal CK of 10 GHz is inputted to this circuit structure, the output signal of 5 GHz with the output amplitude of 0.4 V is obtained as the data output signal OUT of the frequency divider as shown in FIG. 7B. Therefore, by using the flip-flop circuit as shown in FIG. 4, it is possible to achieve the high-speed operation using the clock signal of at least 10 GHz or higher.

Figure 8:
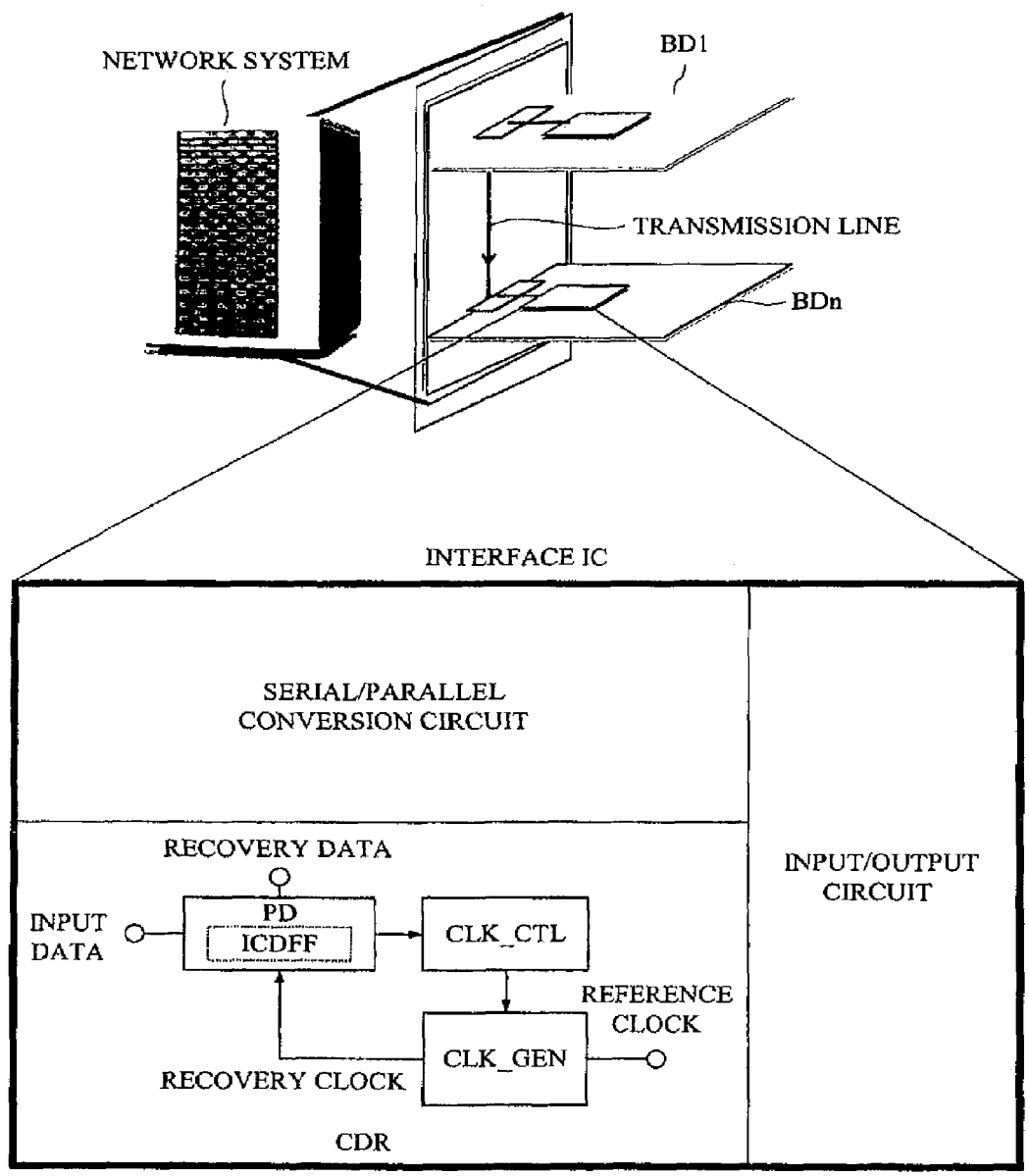
FIG. 8 is a block diagram showing an example of the structure of the network system using the logic circuit according one embodiment of the present invention.
Figure 9:
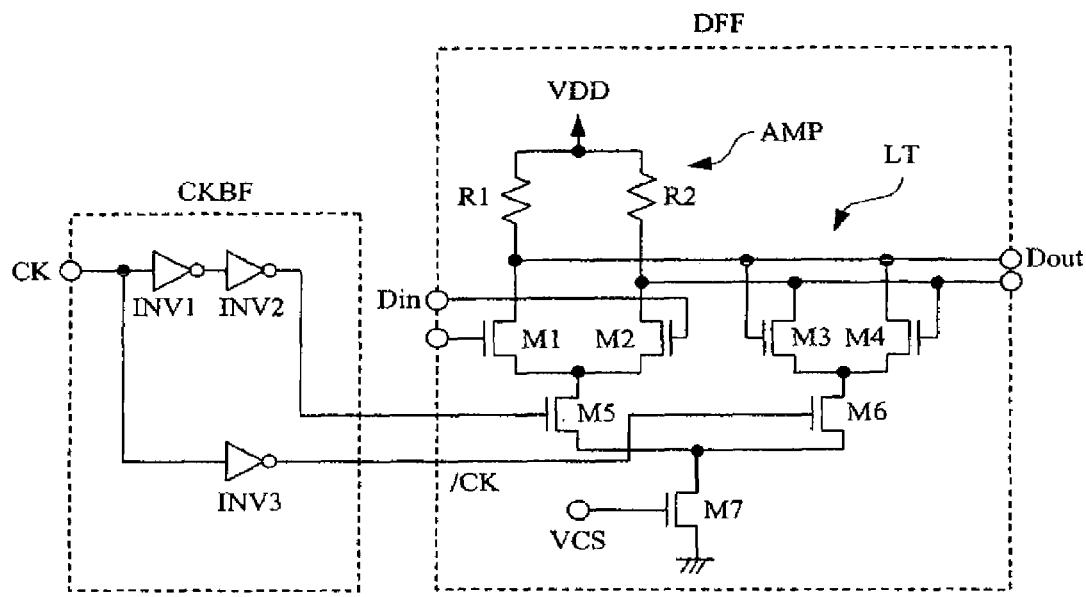
FIG. 9 is a circuit diagram showing an example of the structure of a flip-flop circuit examined prior to the present invention.

FIG. 8 is a block diagram showing an example of the structure of the network system using the logic circuit according one embodiment of the present invention. The network system shown in FIG. 8 is, for example, a server/router/storage or others used for the high-speed communication, and it includes a plurality of boards BD1, . . . , BDn. The data transfer among the boards is performed through the serial transfer at 10 GHz. An interface IC is included in each of the boards, and the interface IC includes, for example, a serial/parallel conversion circuit, an input/output circuit, a clock recovery circuit CDR and others.

CDR is provided with a phase comparator unit PD, a clock control unit CLK_CTL, a clock generating unit CLK_GEN, and others, and the flip-flop circuit ICDFF as shown in FIG. 4 and FIG. 5 is included in PD. In CDR, a serial data input of 10 GHz is received, and the reference clock signal is generated and the data is recovered based on the serial data. At this time, the serial data input and the clock signal generated in CLK_GEN are phase-compared in PD, and CLK_CTL controls CLK_GEN in accordance with the comparison result so that the optimum phase (frequency) can be obtained. Also, the recovered serial data is converted into the parallel data by the serial/parallel conversion circuit, and it is used in the other processing circuits in the board together with the reference clock signal.

As described above, in the network system or the like, the communication speed thereof has been rapidly increased in recent years, and therefore, the high-speed operation of IC has been strongly demanded. In such circumstances, by using the logic circuit as described above, such a demand can be satisfied.

In the foregoing, the invention made by the inventors of the present invention has been concretely described based on the embodiments. However, it is needless to say that the present invention is not limited to the foregoing embodiments and various modifications and alterations can be made within the scope of the present invention.

The technology for a logic circuit according to the present invention is effectively applied to a flip-flop circuit or the like used in the LSI for high-speed communication. Furthermore, the technology of the present invention can be widely applied to various types of logic circuit such as a flip-flop circuit and a selector circuit, in which high processing speed is required.

What is claimed is:

1. A logic circuit, comprising:
   a current signal generating circuit which generates a current signal changing between a first current and a second current smaller than said first current in accordance with alternate voltage level change of a control signal between a first voltage level and a second voltage level;
   a common constant current source generating a third current;
   a current mirror circuit which transfers the current generated in said current signal generating circuit to a transistor element which is connected between a voltage source node and a common node connected to said common constant current source; and
   a logic unit connected in parallel to said transistor element of the current mirror current,
   wherein the parallel connection of said logic unit and said transistor element of the current mirror circuit causes limitation on current supplied to said logic unit,
   wherein said logic unit is put into an active state by being supplied with a current corresponding to a residual obtained by subtracting said second current from said third current when said control signal is the first voltage level, and
   wherein said logic unit is put into an inactive state due to deprivation of the supplied current which is limited to a current corresponding to residual obtained by subtracting said first current from said third current when said control is a second voltage level;
   a logic output data is generated by processing a logic input data when said logic unit is in said active state.

2. The logic circuit according to claim 1, wherein said current mirror circuit is composed of MOS transistors, and
   wherein said second current is set to have a current value in a range where Vgs-Ids characteristics of said MOS transistors form a linear region.

3. The logic circuit according to claim 1, wherein said current signal generating circuit includes:
   a first current source which is connected to said current mirror circuit and generates said second current;
   a switching element which has one end connected to said current mirror circuit and is turned on/off in accordance with said control signal; and
   a second current source which is connected to the other end of said switching element and generates a fourth current, and
   a current obtained by adding said second current and said fourth current corresponds to said first current.

4. The logic circuit according to claim 2, wherein said logic unit includes: a differential amplifier having transistors to be a differential pair, and
   a common node of the transistors to be a differential pair is driven by said fourth current corresponding to residual obtained by subtracting said second current from said third current when said control signal is the first voltage level.

5. A logic circuit, comprising:
   a first current signal generating circuit to which a clock signal is inputted and which generates a first current in accordance with a first voltage level of said clock signal and a second current smaller than said first current in accordance with a second voltage level thereof;
   a first constant current source generates a third current;
   a first current mirror circuit which has a first transfer source node element connected to said first current signal generating circuit and a first transistor element which is connected between a voltage source node and first common node connected to said first constant current source;
   a second current signal generating circuit to which an inverted clock signal of said clock signal is inputted and which generates said first current in accordance with said first voltage level of said inverted clock signal and said second current in accordance with said second voltage level thereof;
   a second constant current source generates a current equal to said third current;
   a second current mirror circuit which has a second transfer source node element connected to said second current signal generating circuit and a second transistor element which is connected between said voltage source node and a second common node connected to said second constant current source, and
   a flip-flop block including a data intake circuit connected in parallel to said first transistor element of the first current mirror circuit and a data latch circuit connected in parallel to said second transistor element of the second current mirror circuit,
   wherein said data intake circuit includes:
   a first transistor and a second transistor which form a differential pair and each of which has a gate to which a logic data to be a complementary signal is inputted;
   a first load element connected to between said voltage source node and a drain of said first transistor; and
   a second load element connected to a drain of said second transistor,
   wherein said data latch circuit includes:
   a third transistor having a drain connected to the drain of said first transistor; and
   a fourth transistor having a drain connected to the drain of said second transistor,
   sources of said first and second transistors are connected to a connection node between said first current mirror circuit and said first constant current source, and
   sources of said third and fourth transistors are connected to said first common node connected to said second constant current source.

6. The logic circuit according to claim 5, wherein said first transfer source element of the first current mirror circuit includes:
   a fifth transistor having a drain connected to said first current signal generating circuit and a gate and a drain connected in common, and
   wherein said transistor element of the first current mirror circuit includes a sixth transistor having a drain connected to said first constant current source and a gate connected to the gate of said fifth transistor,
   wherein said transfer source element of the second current mirror circuit includes:
   a seventh transistor having a drain connected to said second current signal generating circuit and a gate and a drain connected in common, and
   wherein said transistor element of the second current mirror circuit includes an eighth transistor having a drain connected to said second constant current source and a gate connected to the gate of said seventh transistor, wherein said second current is set to have a current value in a range where Vgs-Ids characteristics of said sixth and eighth transistors form a linear region, and wherein said third current is set to have a current value almost equal to a current value obtained by transferring said first current through said first current mirror circuit and/or said second current mirror circuit.

7. The logic circuit according to claim 6, wherein a gate of said third transistor is connected to a drain of said second transistor, and a gate of said fourth transistor is connected to a drain of said first transistor.

8. The logic circuit according to claim 6, wherein said first current signal generating circuit includes:

a third constant current source which is connected to a drain of said fifth transistor and generates said second current; and a ninth transistor having a drain connected to the drain of said fifth transistor and a gate to which said clock signal is inputted, wherein said second current signal generating circuit includes:

a fourth constant current source which is connected to a drain of said seventh transistor and generates said second current; and a tenth transistor having a drain connected to the drain of said seventh transistor and a gate to which said inverted clock signal is inputted, sources of said ninth and tenth transistors are connected in common to a fifth constant current source which generates a fourth current, and a value obtained by adding said second current and said fourth current corresponds to said first current.

9. A logic circuit, comprising:

a first current signal generating circuit to which a first control signal is inputted and which generates a first current in accordance with a first voltage level of said first control signal and a second current smaller than said first current in accordance with a second voltage level thereof;

a first current mirror circuit which has a first transfer source node connected to said first current signal generating circuit and a first transistor node;

a first constant current source which is connected to said first transistor node of said first current mirror circuit and generates a third current;

a second current signal generating circuit to which a second control signal is inputted and which generates said first current in accordance with said first voltage level of said second control signal and said second current in accordance with said second voltage level thereof;

a second current mirror circuit which has a second transfer source node connected to said second current signal generating circuit and a second transistor node;

a second constant current source which is connected to said second transistor node of said second current mirror circuit and generates said third current; and a selector block including a first selector logic unit and a second selector logic unit, wherein said first selector logic unit includes:

a first transistor having a gate to which a first logic data is inputted;

a second transistor having a gate to which a first inverted logic data which is an inverted signal of said first logic data is inputted;

a first load element connected to a drain of said first transistor; and a second load element connected to a drain of said second transistor, wherein said second selector logic unit includes:

a third transistor having a gate to which a second logic data is inputted and a drain connected to the drain of said first transistor; and a fourth transistor having a gate to which a second inverted logic data which is an inverted data of said second logic data is inputted and a drain connected to the drain of said second transistor, sources of said first and second transistors are connected to a connection node between said first current mirror circuit and said first constant current source, and sources of said third and fourth transistors are connected to a connection node between said second current mirror circuit and said second constant current source.

10. The logic circuit according to claim 9, wherein said first current mirror circuit includes:

a fifth transistor having a drain connected to said first current signal generating circuit and a gate and a drain connected in common; and a sixth transistor having a drain connected to said first constant current source and a gate connected to a gate of said fifth transistor, wherein said second current mirror circuit includes:

a seventh transistor having a drain connected to said second current signal generating circuit and a gate and a drain connected in common; and an eighth transistor having a drain connected to said second constant current source and a gate connected to a gate of said seventh transistor, wherein said second current is set to have a current value in a range where Vgs-Ids characteristics of said sixth and eighth transistors form a linear region, and wherein said third current is set to have a current value almost equal to a current value obtained by transferring said first current through said first current mirror circuit and/or said second current mirror circuit.

* * * * *